United States Patent
Chen

(10) Patent No.: US 7,182,124 B2
(45) Date of Patent: Feb. 27, 2007

(54) HEAT SINK STRUCTURE

(75) Inventor: Wan-Tien Chen, Taipei (TW)

(73) Assignee: Egbon Electronics Ltd. (TW)

( * ) Notice: Subject to any disclaimer, the term of this patent is extended or adjusted under 35 U.S.C. 154(b) by 121 days.

(21) Appl. No.: 10/929,563

(22) Filed: Aug. 31, 2004

(65) Prior Publication Data

US 2006/0042782 A1    Mar. 2, 2006

(51) Int. Cl.
*F28F 7/00* (2006.01)
(52) U.S. Cl. .................... 165/80.3; 165/185
(58) Field of Classification Search ........... 165/80.2, 165/80.3, 185
See application file for complete search history.

(56) References Cited

U.S. PATENT DOCUMENTS

| | | | | |
|---|---|---|---|---|
| 4,620,216 A | * | 10/1986 | Horvath | 257/713 |
| 4,899,210 A | * | 2/1990 | Lorenzetti et al. | 257/712 |
| 5,701,951 A | * | 12/1997 | Jean | 165/121 |
| 5,781,411 A | * | 7/1998 | Feenstra | 165/80.3 |
| 5,825,621 A | * | 10/1998 | Giannatto et al. | 361/701 |
| 5,831,826 A | * | 11/1998 | Van Ryswyk | 361/719 |
| 5,894,882 A | * | 4/1999 | Kikuchi et al. | 165/80.3 |
| 5,930,115 A | * | 7/1999 | Tracy et al. | 361/704 |
| 6,067,227 A | * | 5/2000 | Katsui et al. | 361/695 |
| 6,199,624 B1 | * | 3/2001 | Wotring | 165/80.3 |
| 6,397,931 B1 | * | 6/2002 | Lin et al. | 165/80.3 |
| 6,462,945 B2 | * | 10/2002 | Sloan et al. | 361/687 |
| 6,590,770 B1 | * | 7/2003 | Rogers et al. | 361/697 |
| 6,644,388 B1 | * | 11/2003 | Kilmer et al. | 165/133 |
| 6,729,383 B1 | * | 5/2004 | Cannell et al. | 165/80.3 |
| 6,817,405 B2 | * | 11/2004 | Kamath et al. | 165/80.3 |

* cited by examiner

*Primary Examiner*—Teresa J. Walberg
(74) *Attorney, Agent, or Firm*—Lowe Hauptman & Berner, LLP

(57) ABSTRACT

A heat sink structure comprises: a heat conducting base being provided thereon with a plurality of heat sinking fins arranged longitudinally and transversely to mutually cross each other; with the help of the blowing air blown by an above installed fan, the heat sink can make a fast exchange of the cool air and hot air in the interspace among the heat sinking fins to help dissipate the heat generated by a CPU to the ambient to achieve the fast heat sinking effect. The structure is applied to a heat sink for a computer, an electronic instrument or some other heat generating electric component.

3 Claims, 11 Drawing Sheets

HEAT SINK STRUCTURE

BACKGROUND OF THE INVENTION

1. Field of the Invention

The present invention relates to a heat sink structure, more specifically to a structure of being provided with a plurality of heat sinking fins arranged longitudinally and transversely to mutually cross each other on a heat conducting base.

2. Description of the Prior Art

In the rapid movement of modern computer information, high temperature generating from a CPU whose operation speed becomes faster needs to be temperate relied on heat sinks and fans of high efficiency to maintain the normal operation temperature of a CPU.

A conventional heat sink (as shown in FIG. 10), it is manufactured by method of aluminum extrusion; the heat sink "a" manufactured by method of aluminum extrusion has fins "b" arranged with equidistant spaces in a single direction, when an external fan is installed above the heat sink "a", the airflow created by the fan is divided by the fins "b" and can only flow in the interspace of the fins "b". By the fact that space for flowing of hot air is limited, the hot air in a large amount created by a CPU still accumulates below the fins "b" and is unable to make heat exchange with the cooler air above the fins "b" for achieving the heat sinking effect.

Referring to FIG. 11, to overcome the problem caused by the heat sink as stated above, another conventional heat sink is made by sequentially curving a metallic thin sheet to form a heat sinking fin "c" with plural curves, the top of the fin "c" is formed to have plural inverted "v" shapes, and each curve is cut to form a fine seam "d", so that the airflow created by a fan "e" can flow fast in the interspace of the fin "c". Under such circumstances, although this structure can get an enlarger heat sinking area of the heat sinking fin "c", however, the space for hot airflow is still limited, and the fine seams "d" on the top of the fin "c" only can allow little air to pass through, and if when a CPU generates high temperature by high speed operation, the structure still is unable to effectively make exchange of the cool and hot air to dissipate the heat, thus it is still not ideal in achieving the heat sinking effect.

In view of the above problems, a solution is needed to make fast heat exchange of the cool air and hot air to dissipate the heat generating in the interspace among the heat sinking fins for achieving the fast heat sinking effect. Based on the inventor's professional experience, the present invention satisfies such a need.

SUMMARY OF THE INVENTION

An objective of the present invention is to provide a heat sink structure, which has an improvement that the cool air and hot air in the upper and the lower areas of heat sinking fins can make a fast exchange in the interspace among the heat sinking fins, so that high heat created by a CPU will not accumulate below the heat sinking fins, thereby achieving a fast heat sinking effect.

Another objective of the present invention is to provide a heat sink structure, which has another improvement that the hot air can fast flow in the interspace among the heat sinking fins longitudinally and transversely, so that the heat can dissipate to the ambient to achieve the heat sinking effect.

According to an aspect of the present invention, a structure for heat sink comprises a heat conducting base; and a plurality of heat sinking fins provided thereon said heat conducting base.

According to another aspect of the present invention, in the structure for heat sink, the heat sinking fins are arranged longitudinally and transversely to mutually cross each other.

The present invention will be apparent after reading the detailed description of the preferred embodiments thereof in reference to the accompanying drawings.

BRIEF DESCRIPTION OF THE DRAWINGS

The following drawings are only for illustrating the mutual relationships between the respective portions and are not drawn according to practical dimensions and ratios. In addition, the like reference numbers indicate the similar elements.

DETAILED DESCRIPTION OF THE PREFERRED EMBODIMENT

Figure 1:
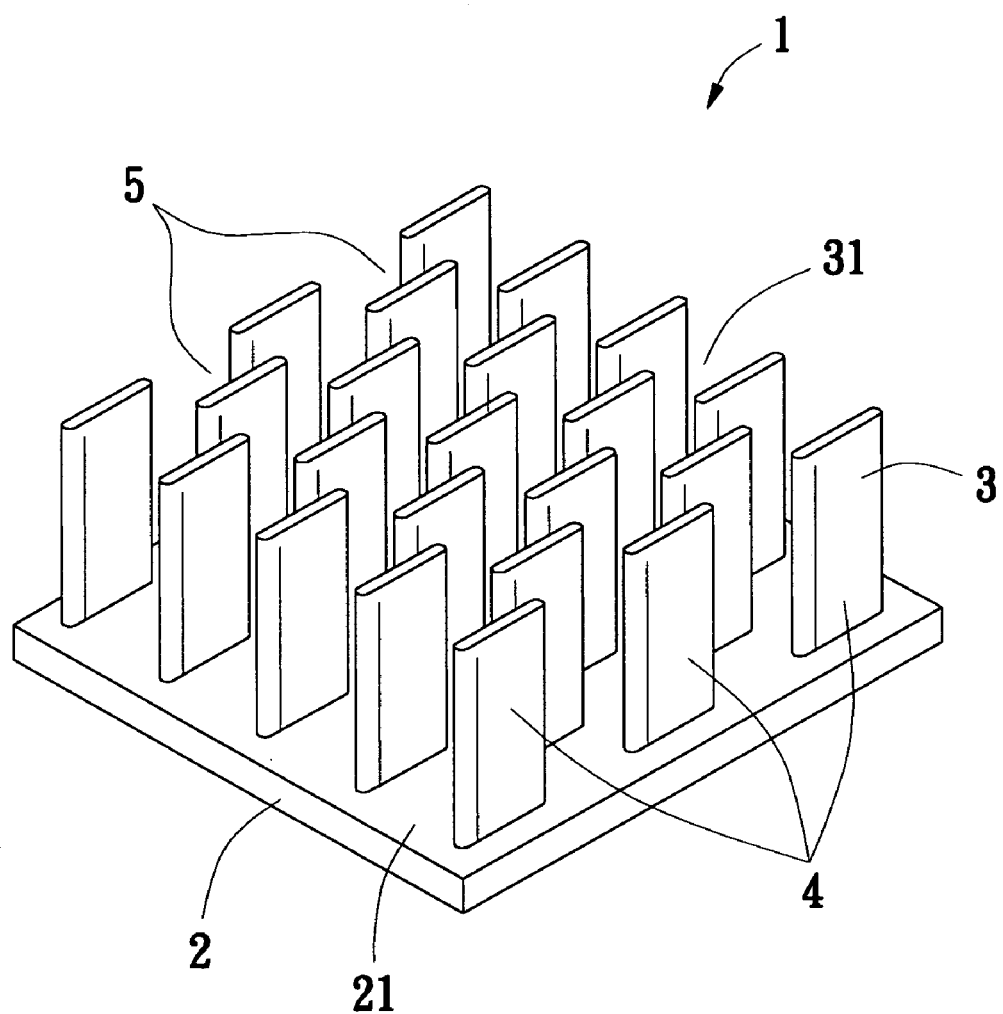
FIG. 1 is a perspective view showing an appearance of the first embodiment of the present invention.
Figure 2:
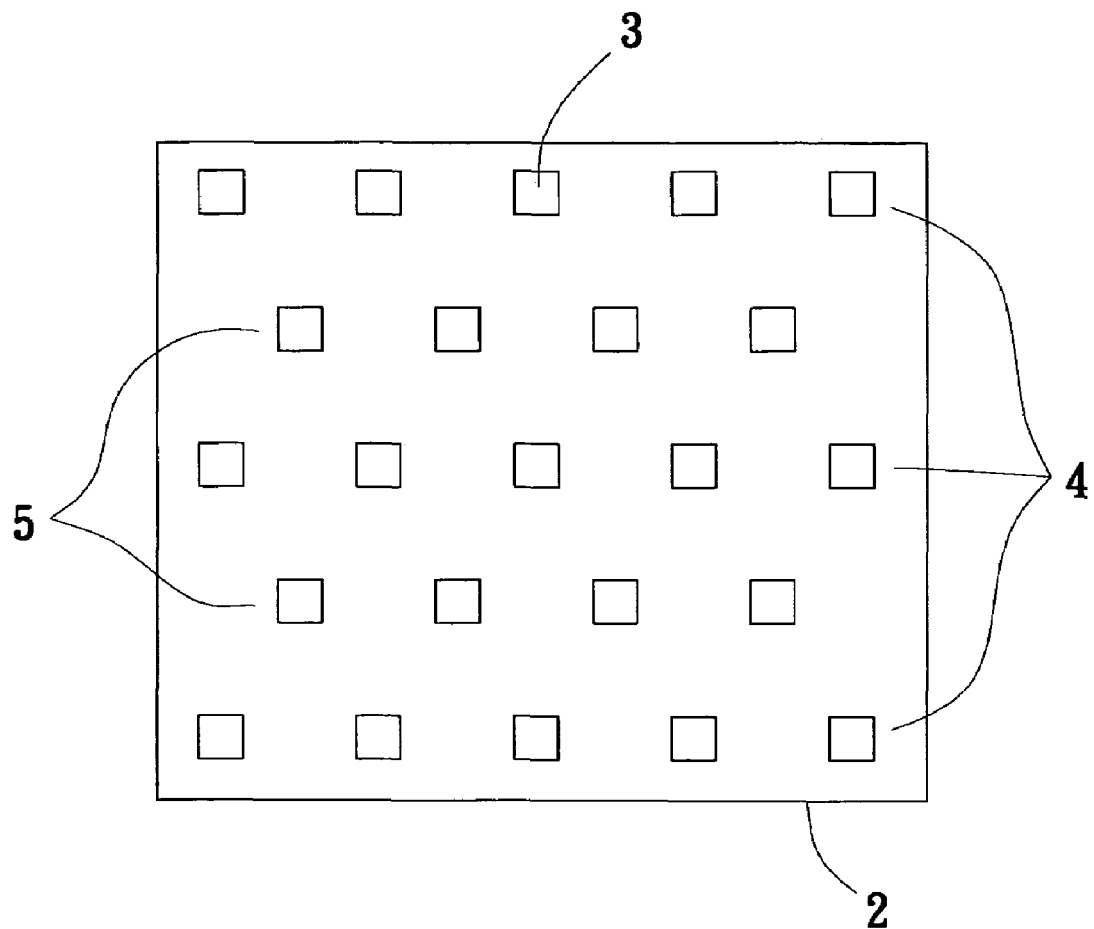
FIG. 2 is a plan view of the first embodiment of the present invention.
Figure 3:
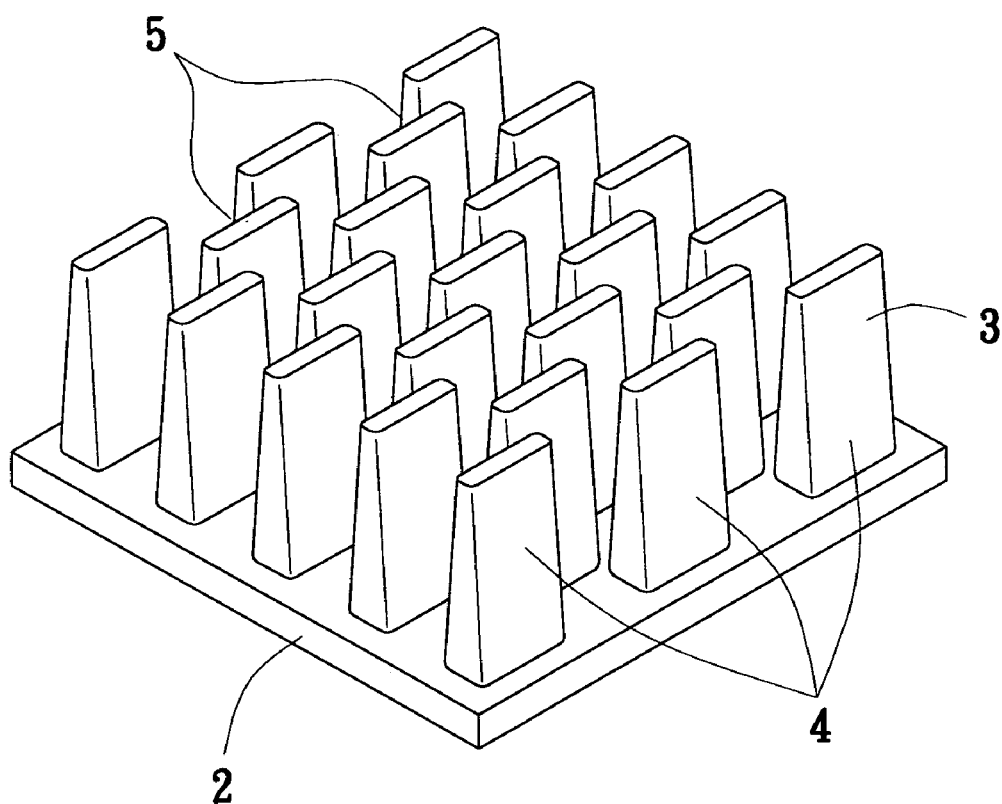
FIG. 3 is another perspective view showing an appearance of the first embodiment of the present invention.

Referring to FIGS. 1–3 showing the first embodiment of heat sink structure 1 of the present invention, the structure comprises: a heat conducting base 2 having thereon a plane surface 21 which is provided thereon with a plurality of heat sinking fins 3, the heat sinking fins 3 are in strip forms each with four round corner edges on the four lateral sides thereof (the forms of the fins can also be square columns, strips like trapezoidal blocks etc.). The heat sinking fins 3 include first fin groups 4 and second fin groups 5, the two fin groups 4 and 5 respectively include a plurality of heat sinking fins 3 arranged in a rectangular array, the first fin groups 4 and the second fin groups 5 are alternately arranged.

Figure 4:
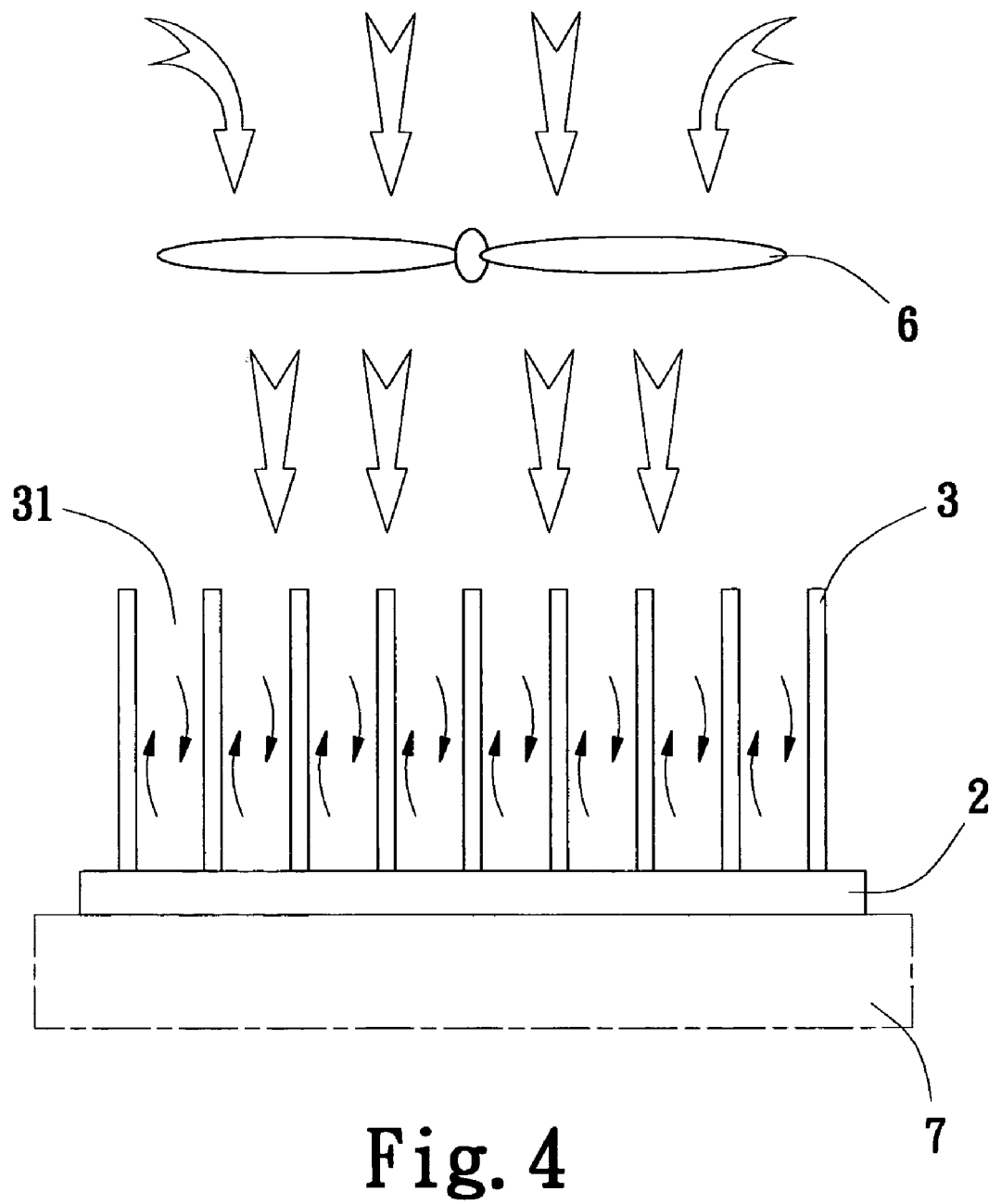
FIG. 4 is a schematic view showing airflows during heat sinking of the present invention.
Figure 5:
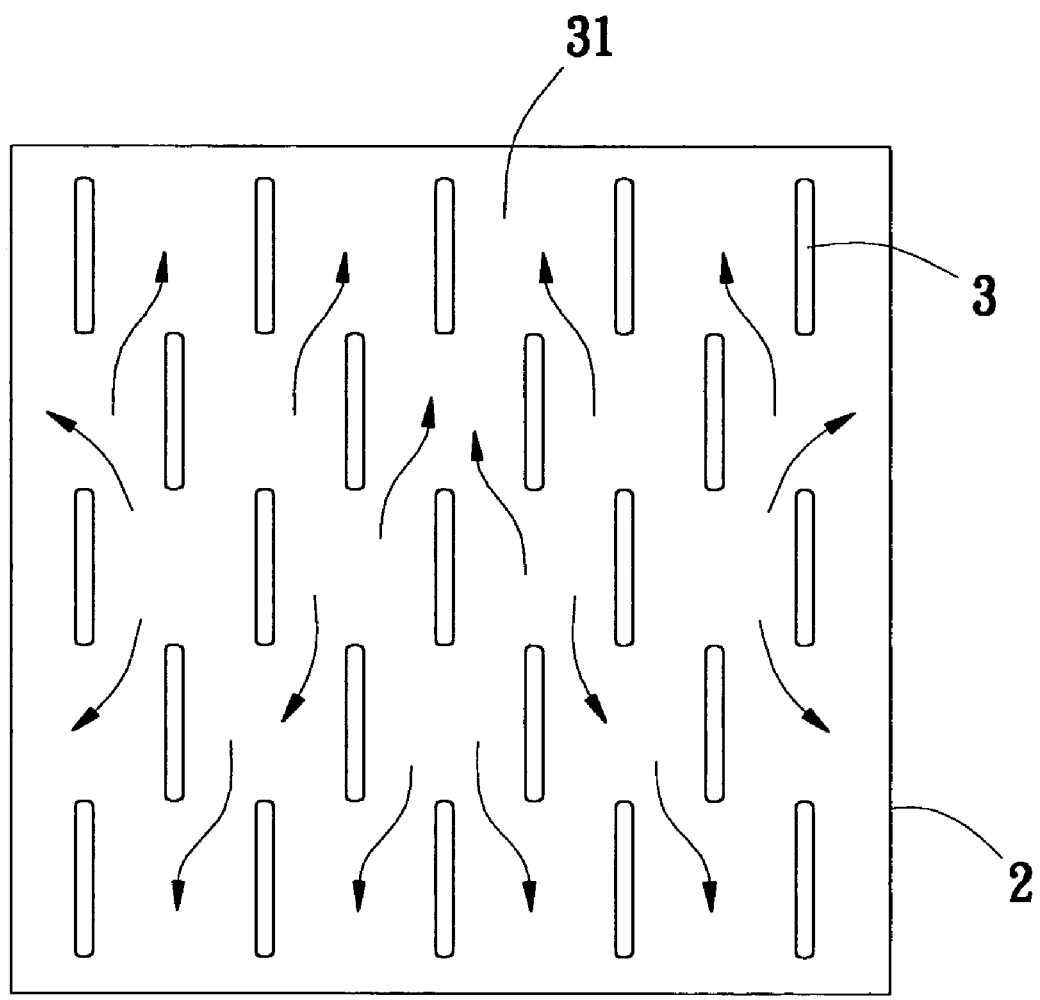
FIG. 5 is another schematic view showing airflows during heat sinking of the present invention.

Referring to FIGS. 4 and 5, a fan 6 is installed above the heat sinking fins 3 of the present invention, while the heat conducting base 2 is connected therebeneath with a CPU 7. When the CPU 7 operates at a high speed, heat generated from it is conducted upwardly through the heat conducting base 2, thus cause most heat generated accumulated under the heat sinking fins 3. When the fan 6 blows, the blowing air flowing in the interspace among the heat sinking fins 3 arranged longitudinally and transversely to mutually cross each other, thereby the cool air and hot air in the inerspace among the heat sinking fins 3 can make a fast exchange, thereby the heat accumulated under the heat sinking fins 3 can be fast dissipated upwardly. And by the fact that the four corner edges on the four lateral sides are round, the hot air can flow smoothly, and gaps 31 formed therebetween the heat sinking fins 3 can help the hot air dissipating faster to the ambient, thereby achieving a fast heat sinking effect.

Figure 6:
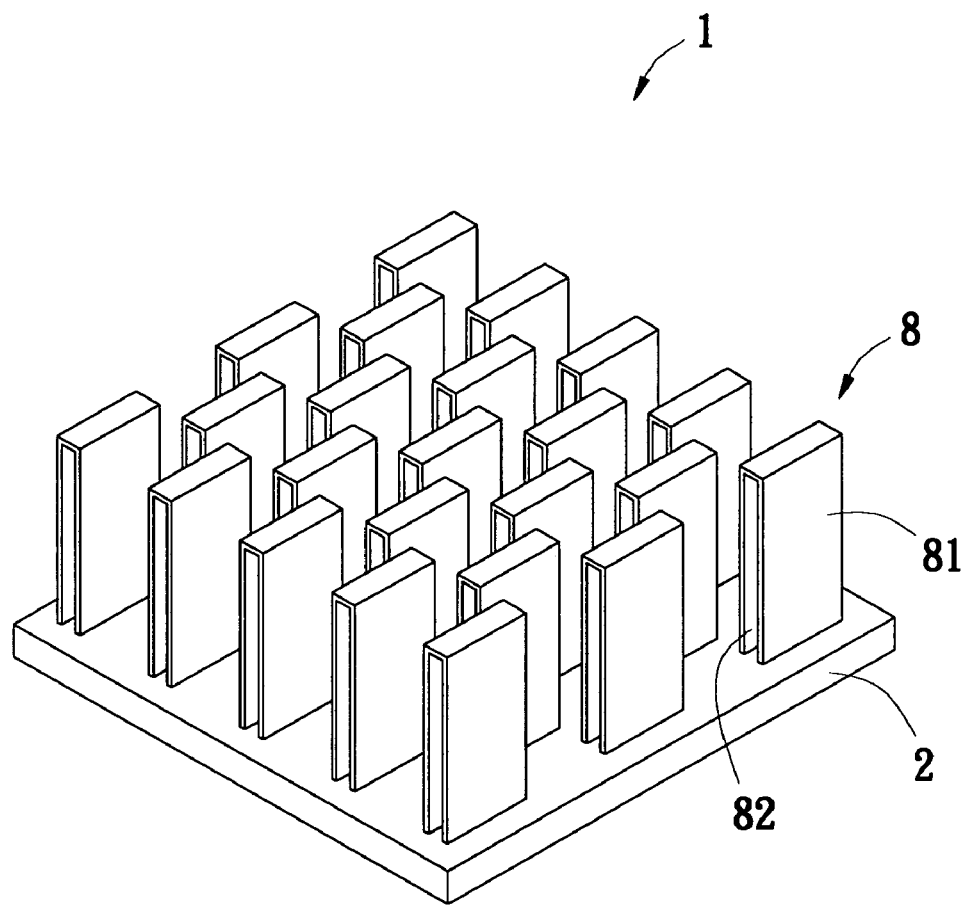
FIG. 6 is a perspective view of the second embodiment of the present invention.
Figure 7:
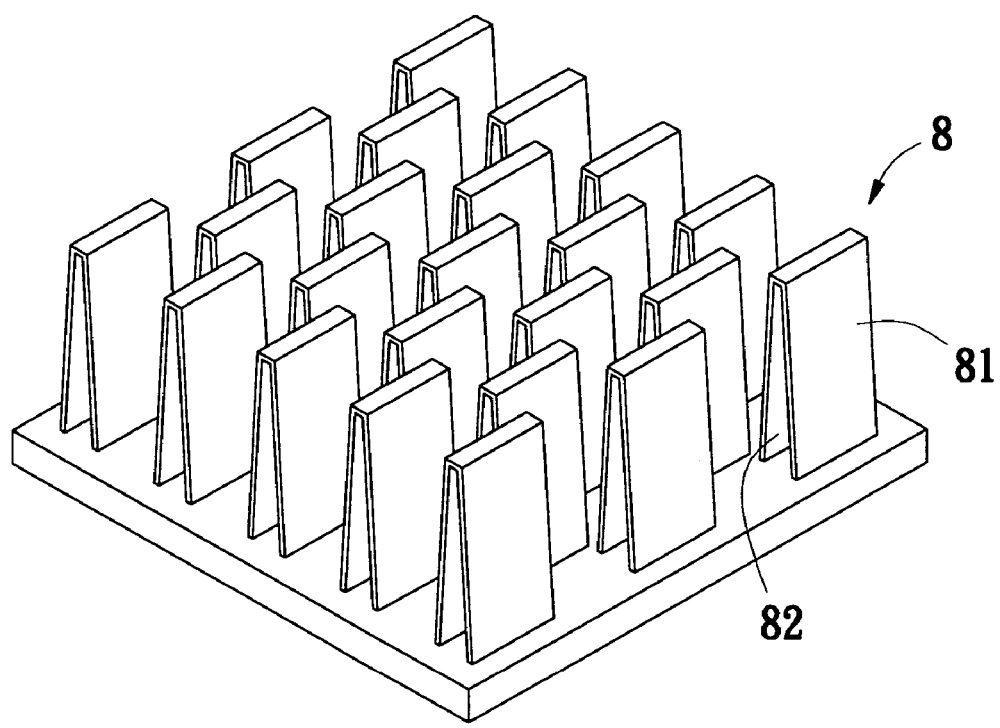
FIG. 7 is another perspective view showing an appearance of the second embodiment of the present invention.

Referring to FIGS. 6 and 7 showing the second embodiment of heat sink structure 1 of the present invention, wherein heat sinking fins 8 of the shapes of strips (they can be trapezoidal alternatively) are formed each by curving a sheet 81 to form a longitudinal passage 82 for passing through, this can increase the heat sinking area of the heat sinking fins 8 and the paths of the airflow, and thereby can increase the heat sinking effect.

Figure 8:
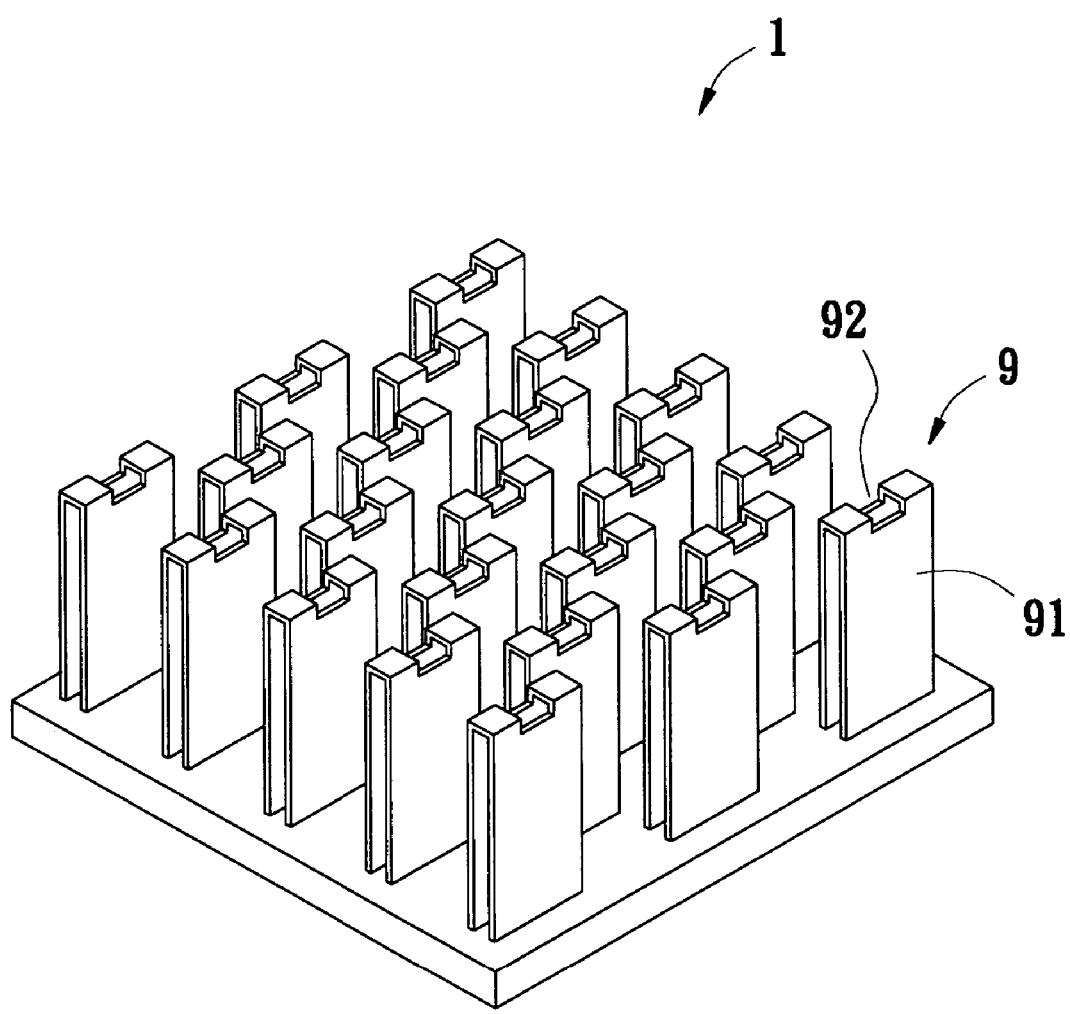
FIG. 8 is a perspective view showing an appearance of the third embodiment of the present invention.
Figure 9:
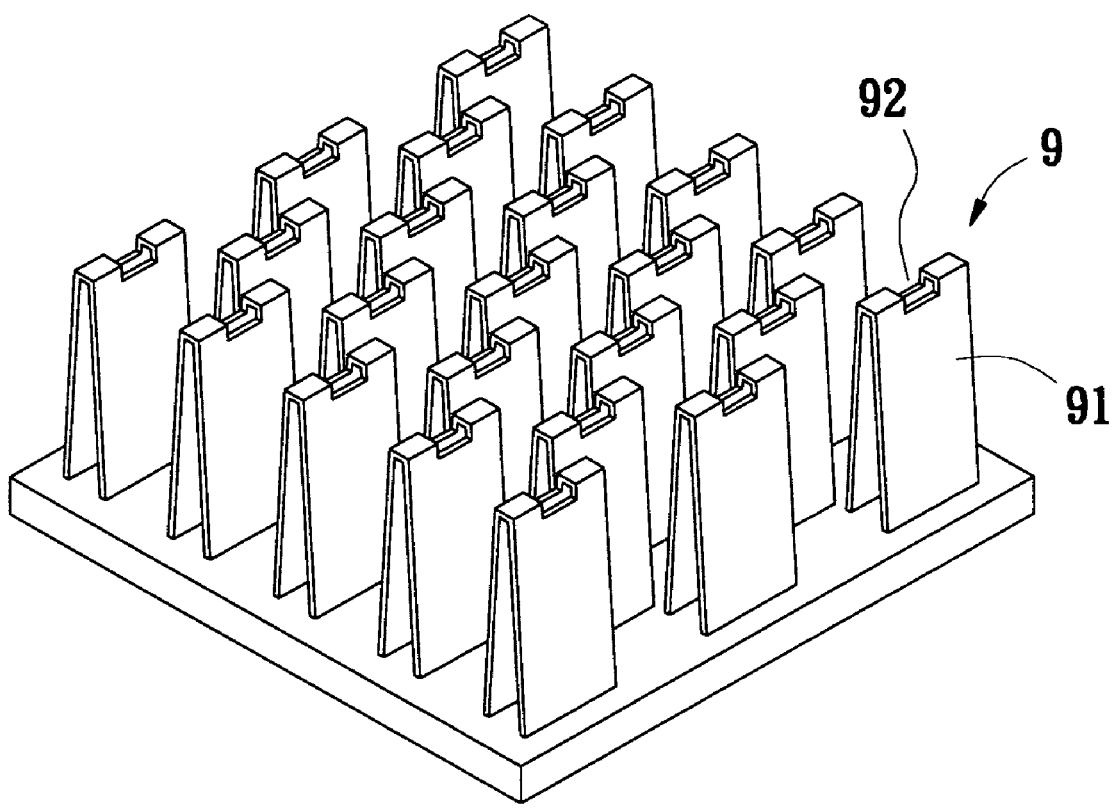
FIG. 9 is another perspective view showing an appearance of the third embodiment of the present invention.
Figure 10:
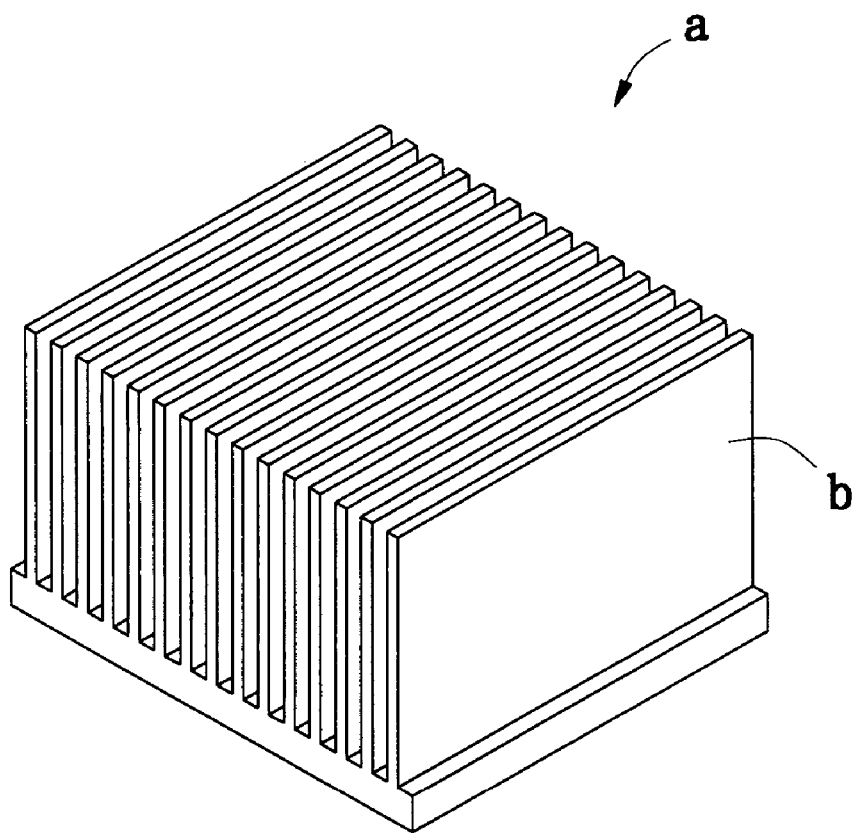
FIG. 10 is a perspective view showing an appearance of a conventional heat sink.
Figure 11:
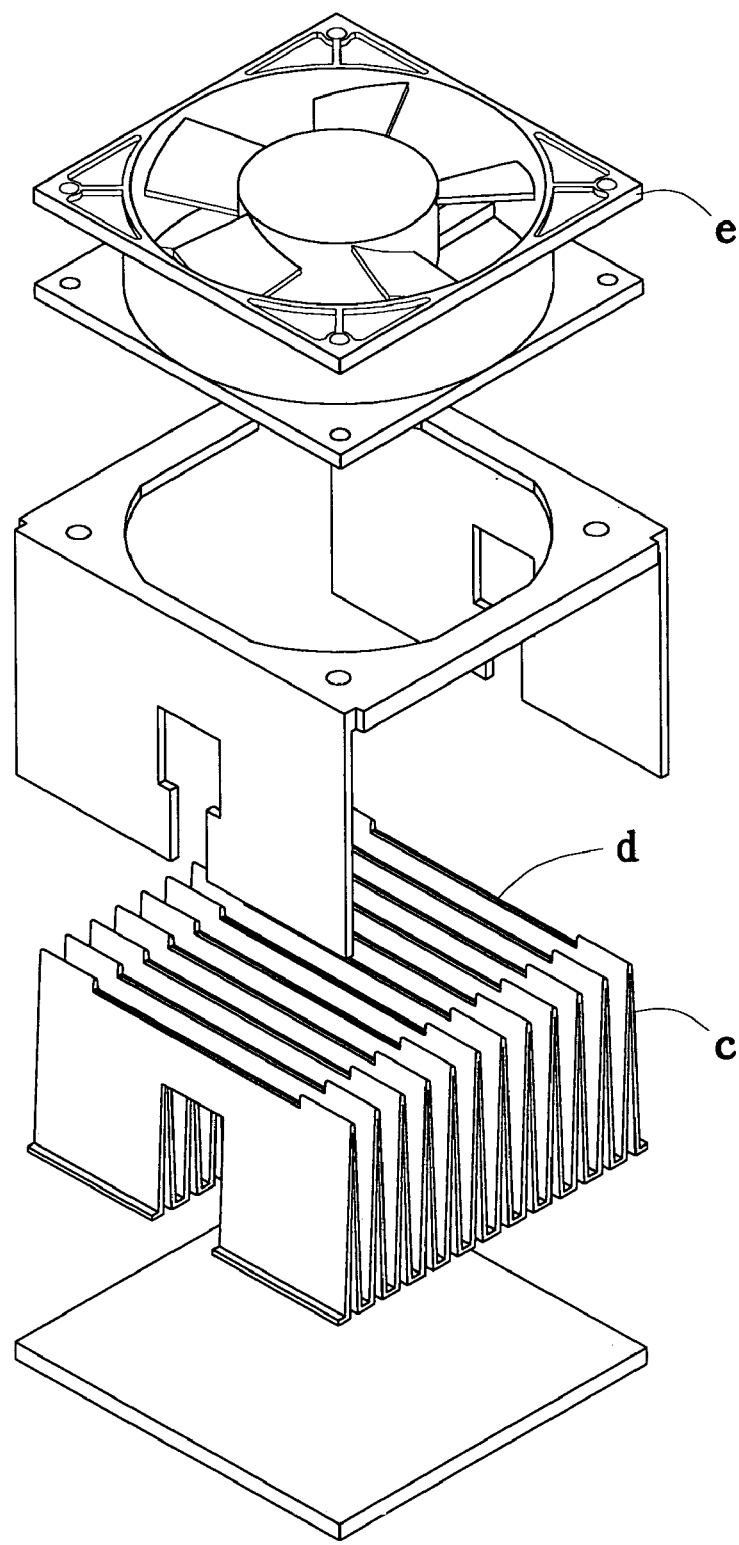
FIG. 11 is an exploded perspective view of another conventional heat sink.

Referring to FIGS. 8 and 9 showing two types of the third embodiment of the present invention, wherein heat sinking fins 9 formed by curving sheets 91 are provided each on its top with a notch 92, this can increase the areas for downward blowing air of the fan 6, so that the blowing air can have more passages to help fast dissipating the hot air outwardly.

The present invention has the following practical advantages:

1. The arrangement mode of the heat sinking fins of the present invention can help to make a fast exchange of cool and hot air in the interspace among the heat sinking fins, thereby the heat generated by a CPU and accumulated under the heat sinking fins can be fast dissipated upwardly and outwardly.

2. Gaps mutually crossing and formed therebetween the heat sinking fins of the present invention can help the hot air to dissipate to the ambient with the help of the blowing air from the fan; thereby achieving a fast heat sinking effect.

In conclusion, the present invention can achieve the expected objectives thereof to provide heat sink structures which can help to make a fast exchange of the cool and hot air in the interspace among the heat sinking fins to fast dissipate the heat accumulated within the heat sinks; the structures are extremely industrially valuable.

Having thus described my invention, what I claim as new and desire to be secured by Letters Patent of the United States are:

The invention claimed is:

1. A heat sinking structure comprising:
   a heat conducting base; and
   a plurality of heat sinking fins arranged longitudinally and transversely in rows and columns to cross one another and each of said heat sinking fins consisting of an integral front sheet, rear sheet and an upper portion connecting said front and rear sheets, and a lower portion of each of said sheets disposed on said base and spaced apart at a distance greater than the upper portion of said sheets to thereby form a trapezoidal shaped opening between said front and rear sheets and each of said heat sinking fins defining an open notch in said upper portion thereof to allow air blown from a fan to flow in interspaces among the heat sinking fins and between said front and rear sheets of each of said fins to achieve a fast heat sinking effect.

2. A heat sinking structure according to claim 1 in which each of said trapezoidal shaped openings on one side of said heat sinking fins face in the same direction and each of the trapezoidal shaped openings on an opposite side of said heat sinking fins facing in an opposite direction.

3. A heat sinking structure according to claim 2 in which said heat conductive base has a rectangular shape and in which said heat sinking fins are arranged in five columns and nine interspaced rows.

\* \* \* \* \*